United States Patent
Nicholson et al.

(10) Patent No.: US 11,886,722 B2
(45) Date of Patent: Jan. 30, 2024

(54) SMART INCLUSION OF TECHNOLOGY AT TIME OF BUILD

(71) Applicant: LENOVO (Singapore) PTE. LTD., New Tech Park (SG)

(72) Inventors: John Weldon Nicholson, Cary, NC (US); Daryl C. Cromer, Raleigh, NC (US); Howard Locker, Cary, NC (US); Mengnan Wang, Chapel Hill, NC (US)

(73) Assignee: Lenovo (Singapore) Pte. Ltd., New Tech Park (SG)

( * ) Notice: Subject to any disclaimer, the term of this patent is extended or adjusted under 35 U.S.C. 154(b) by 379 days.

(21) Appl. No.: 17/218,566

(22) Filed: Mar. 31, 2021

(65) Prior Publication Data
US 2022/0317901 A1 Oct. 6, 2022

(51) Int. Cl.
*G06F 3/06* (2006.01)
*G06F 15/78* (2006.01)
*G11C 16/10* (2006.01)
*G11C 16/04* (2006.01)
*G11C 16/14* (2006.01)

(52) U.S. Cl.
CPC .......... *G06F 3/0632* (2013.01); *G06F 3/0604* (2013.01); *G06F 3/0679* (2013.01); *G06F 15/7882* (2013.01); *G11C 16/10* (2013.01); *G11C 16/14* (2013.01)

(58) Field of Classification Search
CPC ........................ G06F 3/0632; G06F 30/0604
USPC ........................................................ 716/117
See application file for complete search history.

(56) References Cited

U.S. PATENT DOCUMENTS

| | | | |
|---|---|---|---|
| 2005/0039061 A1* | 2/2005 | Schultz | G06F 21/10 713/310 |
| 2006/0120185 A1* | 6/2006 | Brown | G06F 1/04 365/200 |
| 2007/0146005 A1* | 6/2007 | Sauber | G06F 30/30 365/63 |
| 2010/0229062 A1* | 9/2010 | Henry | G11C 17/18 711/E12.007 |
| 2015/0338904 A1 | 11/2015 | Henry et al. | |
| 2017/0286580 A1 | 10/2017 | McLean et al. | |
| 2019/0342404 A1* | 11/2019 | Kundu | H04W 28/0226 |
| 2020/0053433 A1* | 2/2020 | Beals | H04N 21/8453 |
| 2020/0387466 A1* | 12/2020 | Curtis | G06F 13/4068 |
| 2022/0318343 A1* | 10/2022 | Nicholson | G06F 21/73 |

\* cited by examiner

*Primary Examiner* — Suchin Parihar
(74) *Attorney, Agent, or Firm* — Kunzler Bean & Adamson

(57) ABSTRACT

Apparatuses, methods, systems, and program products are disclosed for technology management on a hardware component of a device at the time of assembly. An apparatus has a processor and memory storage that stores code executable by the processor. The processor obtains a feature of the hardware component to be removed from the hardware component and operates a virtual fuse that removes a data region associated with the hardware component and permanently removes access to the feature on the hardware component. In response to operating the virtual fuse to remove access to the feature, the processor may indicate the status of the feature on the hardware component.

20 Claims, 6 Drawing Sheets

SMART INCLUSION OF TECHNOLOGY AT TIME OF BUILD

FIELD

The subject matter disclosed herein relates to computing devices and more particularly relates to selective resource management of features on a hardware component at the time of manufacture.

BACKGROUND

Computing devices have various resources on a hardware component enabled through firmware and system software for the device. The hardware component is designed to execute programs, run system software, process data, or the like. The enabled and disabled features of the hardware component establish a base model for the computing device.

BRIEF SUMMARY

Apparatuses, methods, systems, and program products are disclosed for technology management on a hardware component of a device at the time of assembly. In one embodiment, an apparatus including a processor and a memory storage device that stores code executable by the processor is disclosed. The processor operates a virtual fuse that removes a data region associated with the hardware component and permanently removes access to the feature on the hardware component. In response to operating the virtual fuse that removes access to the feature, the processor may indicate the status of the feature on the hardware component.

In one embodiment, a method is disclosed. The method obtains a feature of a hardware component to be removed from the hardware component and operates a virtual fuse that removes a data region associated with the hardware component and permanently removes access to the feature on the hardware component. In response to operating the virtual fuse to remove access to the feature, the method may indicate the status of the feature on the hardware component.

In one embodiment, a computer program product is disclosed. The computer program product includes a computer-readable storage medium having program instructions embodied therewith. The program instructions obtain a feature of a hardware component to be removed from the hardware component and operate a virtual fuse that removes a data region associated with the hardware component and permanently removes access to the feature on the hardware component. In response to operating the virtual fuse to remove access to the feature, the computer program may indicate the status of the feature on the hardware component.

BRIEF DESCRIPTION OF THE DRAWINGS

A more particular description of the embodiments briefly described above will be rendered by reference to specific embodiments illustrated in the appended drawings. Understanding that these drawings depict only some embodiments and are not, therefore, to be considered to be limiting of scope, the embodiments described and explained with additional specificity and detail through the use of the accompanying drawings, in which.

DETAILED DESCRIPTION

Figure 1:
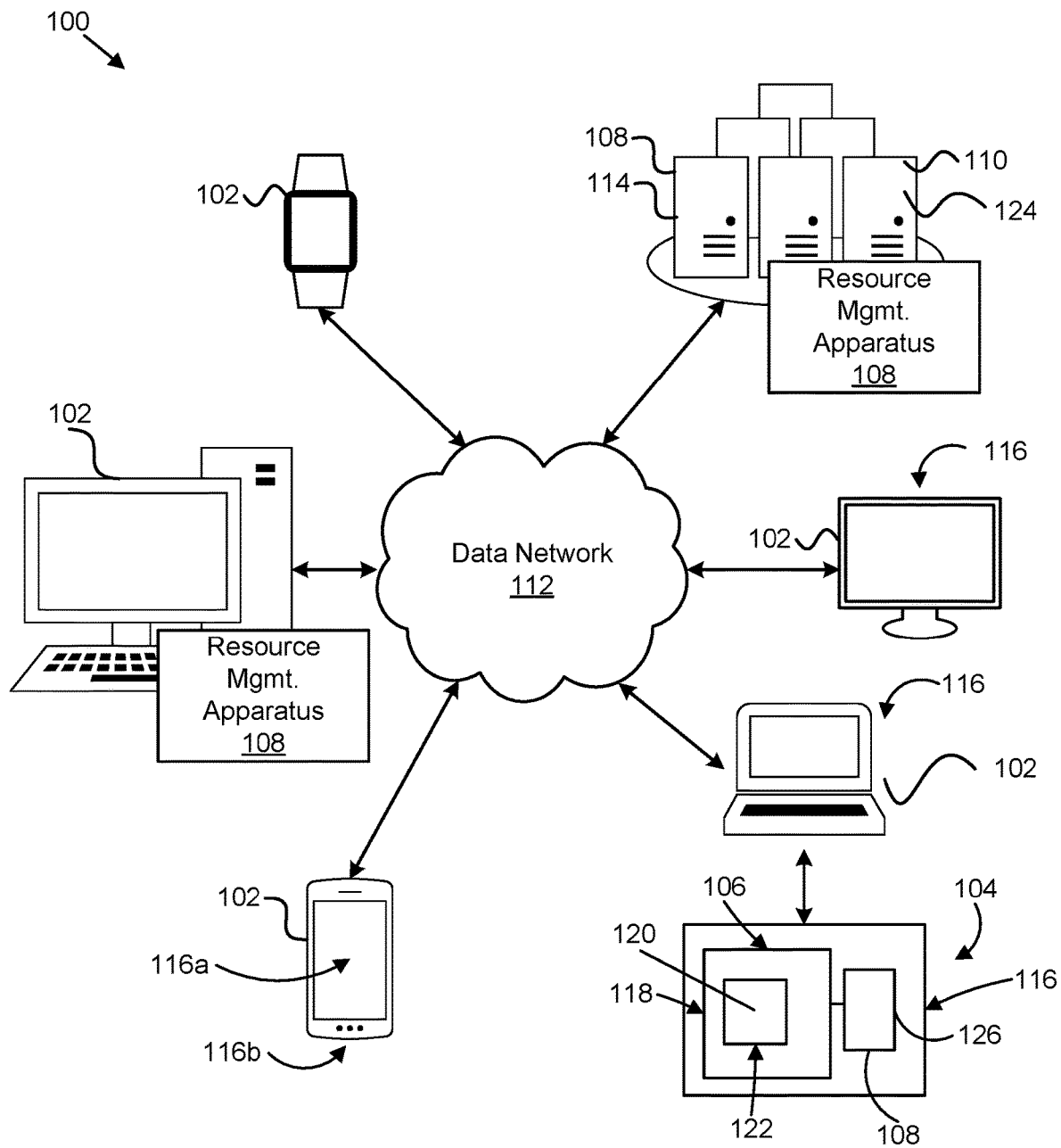
FIG. 1 is a schematic block diagram illustrating one embodiment of a system for hardware component technology feature management during assembly of the computing device.

As appreciated by one skilled in the art, aspects of the embodiments may be embodied as a system, method, or program product. Accordingly, embodiments may take the form of an entirely hardware embodiment, an entirely software embodiment (including firmware, resident software, micro-code, etc.), or an embodiment combining software and hardware aspects that may all generally be referred to herein as a "circuit," "module" or "system." Furthermore, embodiments may take the form of a program product embodied in one or more computer-readable storage devices storing machine-readable code, computer-readable code, and/or program code, referred hereafter as code. The storage devices may be tangible, non-transitory, and/or non-transmission. The storage devices may not embody signals. In a specific embodiment, the storage devices only employ signals for accessing code.

Many of the functional units described in this specification have been labeled as modules to emphasize their implementation independence more particularly. For example, a module may be implemented as a hardware circuit comprising custom VLSI circuits or gate arrays, off-the-shelf semiconductors such as logic chips, transistors, or other discrete components. A module may also be implemented in programmable hardware devices such as field-programmable gate arrays, programmable array logic, programmable logic devices, or the like.

Modules may also be implemented in code and/or software for execution by various types of processors. An identified module of code may, for instance, comprise one or more physical or logical blocks of executable code, which may, for instance, be organized as an object, procedure, or function. Nevertheless, the executables of an identified module need not be physically located together but may comprise disparate instructions stored in different locations that, when joined together logically, comprise the module and achieve the module's stated purpose.

A code module may be a single instruction or many instructions and may even be distributed over several different code segments, among various programs, and across several memory devices. Similarly, operational data may be identified and illustrated herein within modules and may be embodied in any suitable form and organized within any appropriate data structure type. The operational data may be collected as a single data set or distributed over different locations, including other computer-readable storage devices. Where a module or portions of a module are implemented in software, the software portions are stored on one or more computer-readable storage devices.

Any combination of one or more computer-readable mediums may be utilized. The computer-readable medium may be a computer-readable storage medium. The computer-readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific embodiments (a non-exhaustive list) of the storage device would include the following: an electrical connection having one or more wires, a portable computer diskette, a hard disk, a random-access memory (RAM), a read-only memory (ROM), an (electronically) erasable programmable read-only memory (EPROM, EEPROM, and/or Flash memory), a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

Code for carrying out operations for various embodiments may be written in any combination of one or more programming languages, including an object-oriented programming language such as Python, Ruby, Java, Smalltalk, C++, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer, or entirely on the remote computer or server. In the latter scenario, the remote computer may connect to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all the items are mutually exclusive unless expressly specified otherwise. The terms "a," "an," and "the" also refer to "one or more" unless expressly specified otherwise.

Furthermore, the described features, structures, or characteristics of the embodiments may combine in any suitable manner. In the following description, numerous specific details are provided, such as embodiments of programming, software modules, user selections, network transactions, database queries, database structures, hardware modules, hardware circuits, hardware chips, etc., to provide a thorough understanding of embodiments. However, one skilled in the relevant art would recognize that embodiments may be practiced without one or more of the specific details or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. Each block of the schematic flowchart diagrams and/or schematic block diagrams, and combinations of blocks in the schematic flowchart diagrams and/or schematic block diagrams, can be implemented by code. This code may be provided to a processor of a general-purpose computer, a cellphone, a special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, another programmable machine, or other devices to produce a computer-implemented process such that the code which executes on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods, and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may indicate only the logical flow of the depicted embodiment. For instance, an arrow may indicate a waiting or monitoring period of unspecified duration between the illustrated embodiment's enumerated steps. Each block of the block diagrams and/or flowchart diagrams, and combinations of blocks in the block diagrams and/or flowchart diagrams, can be implemented by particular/special purpose hardware-based systems that perform the specified functions or acts or combinations of special purpose hardware and code.

The description of elements in each figure may refer to elements of proceeding figures. Like numbers refer to like elements in all figures, including alternate embodiments of like elements.

An apparatus, in one embodiment, includes a processor and a memory that stores code executable by the processor. In various embodiments, the apparatus obtains a feature of a hardware component to be removed from the hardware component, operates a virtual fuse that removes a data region associated with the hardware component and permanently removes access to the feature on the hardware component, and indicates the status of the feature on the hardware component in response to operating the virtual fuse to remove access to the feature.

In one embodiment, the virtual fuse is read by a driver of system software for the hardware component.

In one embodiment, the firmware of the hardware component has a plurality of data regions. Each data region in the plurality of data regions is associated with a singular feature of the hardware component. The first feature of the hardware component is permanently removed from the hardware component. A second feature of the hardware component is preserved within the hardware component.

In one embodiment, the virtual fuse erases the data region comprising a firmware for the feature of the hardware component.

In one embodiment, the virtual fuse blows an electronic fuse to an electronic circuit that controls the feature in the firmware of the hardware component. When the electronic fuse is blown, the electronic circuit and the hardware component's firmware are not accessible by the processor.

In various embodiments, the virtual fuse operates more than one step to remove the data region from the firmware associated with the feature of the hardware component. For example, the virtual fuse erases the firmware of the data region for the feature on the hardware component, writes no-op instructions on the data region of the firmware related to the feature of the hardware component, and blows a fuse to an electronic circuit associated with the feature of the hardware component.

The memory storage device can be an Electronically Erasable Programmable Read-Only Memory (EEPROM) device in one embodiment. An entirety of the EEPROM device may be erased reprogrammed to remove the data region associated with the feature removed from the hardware component. In various embodiments, the memory storage device may include EPROM, EEPROM, and/or a flash memory that uses a standard PC voltage to erase and reprogram the data region associated with the feature removed from the hardware component. The virtual fuse may be an external virtual fuse block located externally from the hardware component having the processor and the memory storage device.

One embodiment of a method for selectively disabling technology during the device assembly is described. The method includes obtaining a feature of a hardware component to be removed from the hardware component and operating a virtual fuse that removes a data region associated with the hardware component and permanently removes access to the feature on the hardware component. The method further includes indicating the status of the feature on the hardware component in response to operating the virtual fuse to remove access to the feature.

In one embodiment, the method includes operating the virtual fuse to write no-op instructions on the data region of the firmware for the hardware component that renders the feature of the hardware component inoperable.

In various embodiments, the method includes operating the virtual fuse to erase the data region, including the firmware for the hardware component's feature, and/or operating the virtual fuse in other areas of the circuit to erase the data region permanently. For example, the method may operate a virtual fuse that further includes blowing an electronic fuse to an electronic circuit of the data region associated with the feature. In one embodiment, the virtual fuse operates more than one step to remove the data region from the firmware associated with the feature of the hardware component. For example, the method may include erasing the firmware of the data region for the feature on the hardware component, operating the virtual fuse to write no-op instructions on the data region of the firmware associated with the feature of the hardware component, and blowing a fuse to an electronic circuit associated with the feature of the hardware component.

In various embodiments, the method includes erasing an entirety of an EEPROM device and reprogramming the EEPROM device to remove the data region associated with the feature to be removed from the hardware component. The method may remove the feature using a standard PC voltage to erase and reprogram the data region of an EPROM, EEPROM, and/or flash memory device associated with the feature removed from the hardware component.

In various embodiments, an external virtual fuse block that is located externally from the hardware component includes all or part of the virtual fuse. For example, the method may further include writing no-op instructions to the data region and/or including firmware for the feature to be removed from the hardware component. In this configuration, the external virtual fuse block can be retained separately from the hardware component.

A computer program product for technology management on a hardware component of a device at the time of assembly, in one embodiment, has a computer-readable storage medium with program instructions embodied therewith. The program instructions are executable by a processor to cause the processor to obtain a feature of a hardware component to be removed from the hardware component, operate a virtual fuse that removes a data region associated with the hardware component and permanently removes access to the feature on the hardware component, and indicate a status of the feature on the hardware component in response to operating the virtual fuse to remove access to the feature.

FIG. 1 is a schematic block diagram illustrating one embodiment of a system 100 for selectively removing technologies from an information handling device or a computing device 102 during or at the time of the device assembly. In one embodiment, the system 100 includes one or more computing devices 102 having one or more circuit boards 104 with various hardware components 106 that enable various technologies on the circuit board 104. One or more resource management apparatuses 108 may be located on the circuit board 104 and/or located on a separate master management device 110. The system 100 may include one or more data networks 112 and/or one or more servers 114.

In one embodiment, the resource management apparatus 108 is located on the circuit board 104 and communicates with the master management device 110 on the server 114. In another embodiment, the resource management apparatus 108 is located on the server 114 and controls the computing device 102. The resource management apparatus 108 may be located on both the computing device 102 and one or more servers 114. As used herein, a resource management apparatus 108 can include the master management device 110 located on a separate device (e.g., the server 114) and/or a resource management apparatus 108 located directly on the apparatus 200 or another location on the computing device 102.

Although a specific number of computing devices 102, circuit boards 104, hardware components 106, resource management apparatuses 108, data networks 112, and servers 114 are depicted in FIG. 1, one of skill in the art would recognize that the system 100 may include any number of computing devices 102, circuit boards 104, hardware components 106, resource management apparatuses 108, master management devices 110, data networks 112, and/or servers 114.

In one embodiment, the system 100 includes one or more computing devices 102, each having a circuit board 104 with various features 116 encoded within the firmware 118 to activate and control various hardware components 106. Data regions 120 of firmware 118 may provide a mechanism for controlling all or a part of the functionality, technology, and/or features 116 enabled/disabled on the hardware component 106. In general, enabling a feature 116 makes the technology available to the computing device 102 and/or the circuit board 104. Similarly, disabling a feature 116 removes the associated technology from the computing device 102 and/or the circuit board 104.

The computing devices 102 may be embodied as one or more of a desktop computer, a laptop computer, a tablet computer, a smart phone, a smart speaker (e.g., Amazon Echo®, Google Home®, Apple HomePod®), an Internet of Things device, a security system, a set-top box, a gaming console, a smart TV, a smart watch, a fitness band or other wearable activity tracking device, an optical head-mounted display (e.g., a virtual reality headset, smart glasses, head phones, or the like), a High-Definition Multimedia Interface ("HDMI") or other electronic display dongle, a personal digital assistant, a digital camera, a video camera, an IoT vehicle (e.g., car, boat, airplane, etc.) or another computing device comprising a processor (e.g., a central processing unit ("CPU"), a processor core, a field programmable gate array ("FPGA") or other programmable logic, an application specific integrated circuit ("ASIC"), a controller, a microcontroller, and/or another semiconductor integrated circuit device), a volatile memory, and/or a non-volatile storage medium, a display, a connection to a display, and/or the like.

Figure 2:
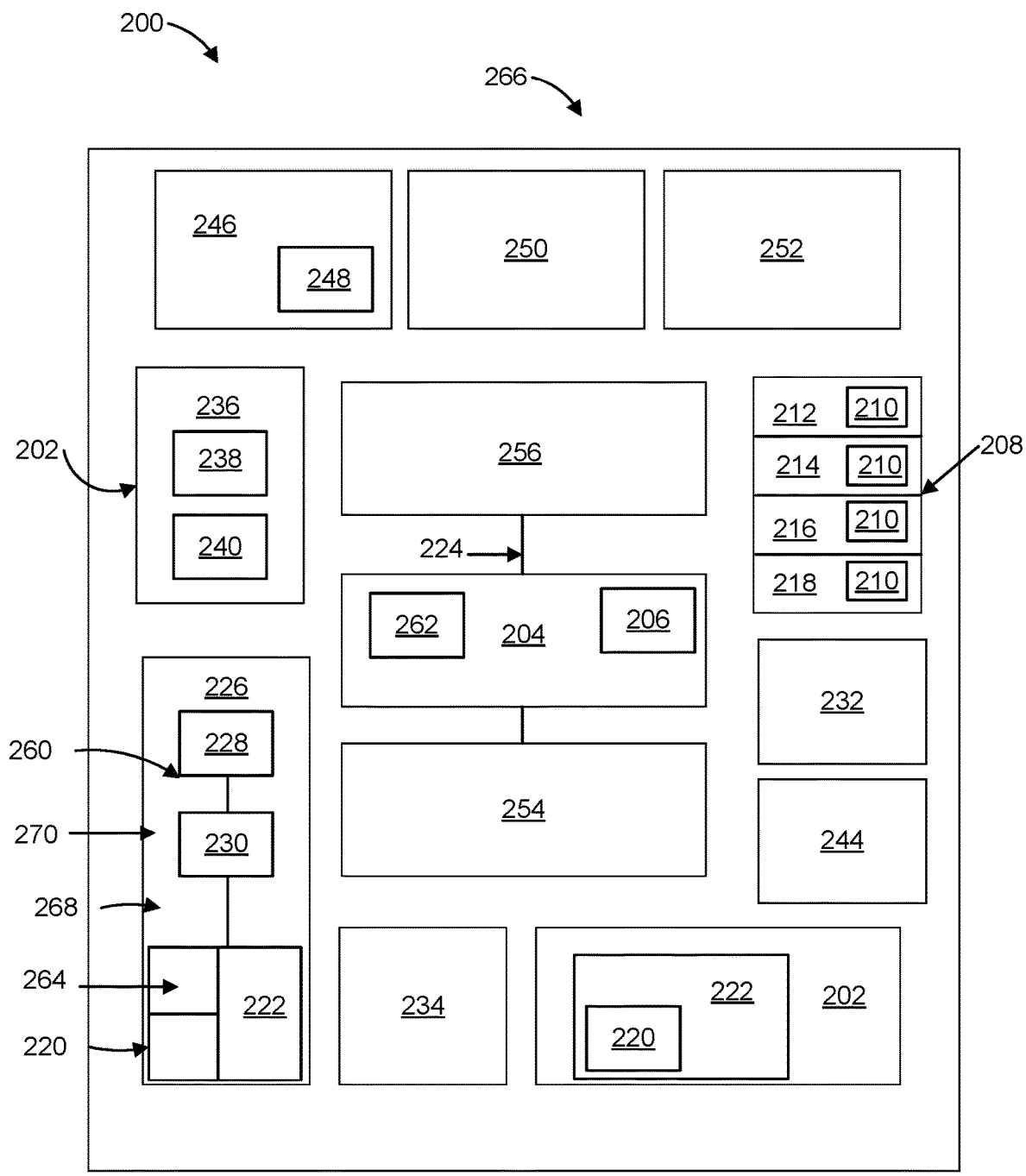
FIG. 2 is a schematic block diagram illustrating one embodiment of a hardware component for technology management during assembly of the computing device.

FIGS. 1 and 2 illustrate the connection of the resource management apparatus 108 with the computing device 102 to disable features 116 from the hardware component 106. The resource management apparatus 108 is generally configured to determine various enabled technologies and/or features 116 and/or disable the selected features 116. A feature 116 is a technology of a hardware component 106 that can be enabled or disabled on the circuit board 104, for example, a video codec and an audio codec.

The resource management apparatus 108 obtains various features 116 of the hardware components 106 to be removed from the circuit board 104 and operates a virtual fuse 122 to selectively remove one or more data regions 120 associated with the feature 116. This permanently disables the feature 116, which is no longer available to the processor. The resource management apparatus 108 indicates the status of the feature 116 on the hardware component 106 in response to operating the virtual fuse 122 and removing access to the indicated the feature 116.

Firmware 118 for the hardware component 106 can have a plurality of data regions 120. In this configuration, each data region 120 may be associated with one or more features 116 on the hardware component 106. For example, the data region 120 of a video codec 228 (e.g., first the feature 116a) on the hardware component 106 can be permanently removed, and the data region 120 of an audio codec 230 (e.g., second the feature 116b) for the hardware component 106 may be preserved as a feature 116 of the hardware component 106.

In this manner, the resource management apparatus 108 may monitor, control, and/or modify the technologies and features 116 available on the hardware component 106 even after the initial circuit board 104 build. For example, the resource management apparatus 108 may modify the features 116 of the circuit board 104 during a computer/cellphone assembly of a computing device 102.

Since a first company (e.g., a chipmaker) may manufacture the chipset and/or circuit board 104 at a first facility and a second company (e.g., a device assembler) may assemble the circuit board 104 in a computing device 102 at a second facility, the resource management apparatus 108 may reduce exposure to infringement claims to both companies. The resource management apparatus 108 can modify the enabled features 116 after the manufacture of the circuit board 104.

For example, the resource management apparatus 108 can modify features 116 during assembly of the computing device 102 and/or remotely afterward. The server 114 can use the resource management apparatus 108 to remotely disable features 116 of the computing device 102 by targeting data regions 120 of the firmware 118 and/or erasing the firmware 118 and reinstalling the firmware 116. This feature limits the exposure of the chipmaker and/or the assembler to later claims of infringed rights without proper payment for licensing fees. For example, the assembler can enable or disable the technology and features 116 on the circuit board 104, thereby better controlling the computing device features sold to the consumer.

In response to disabling a feature 116, the resource management apparatus 108 may indicate the feature's 116 status on the hardware component 106. Specifically, the resource management apparatus 108 may update a database and/or use the database to calculate royalties. The hardware component 106 and/or resource management apparatus 108 can display this information to the end-user and/or a manufacturer's representative. The resource management apparatus 108 may indicate to separate the master management device 110 on the server 114 that the feature 116 was or was not successfully removed and/or disabled. In one embodiment, when the resource management apparatus 108 indicates to separate the master management device 110 that the feature 116 was not successfully removed, a separate master management device 110 connects to the computing device 102 through the server 114 to remotely disable the feature 116.

In certain embodiments, the resource management apparatus 108 may be partially or entirely included on the circuit board 104. Similarly, the resource management apparatus 108 may be partially or entirely installed on the master management device 110. The resource management apparatus 108 can control which features 116 are enabled on the circuit board 104. Depending on the enabled technologies of the circuit board 104, the manufacturer (e.g., device assembler) may determine a price for the computing device 102 that covers any potential costs of any licensing fees, etc. In addition, the resource management apparatus 108 enables the device assembler to offer the same device at different price points, e.g., by disabling unpaid features 116 on a computing device 102.

The resource management apparatus 108 may include a hardware device that moderates a hardware component 106 of a circuit board 104. For example, the resource management apparatus 108 may regulate one or more computing devices 102 such as a secure hardware dongle or other hardware appliance device, e.g., a set-top box, a network appliance, etc. In various embodiments, the computing device 102 may include a head-mounted display, a laptop computer, a server 114, a tablet computer, a smartphone, a security system, a network router or switch, or the like. The resource management apparatus 108 may connect to the computing device 102 either by a wired connection (e.g., a universal serial bus ("USB") connection) or a wireless connection (e.g., Bluetooth®, Wi-Fi, near-field communication ("NEC"), LTE, 5G, or the like).

A hardware device of the resource management apparatus 108 and/or a hardware component 106 on the circuit board 104 may include a power interface, a wired and/or wireless network interface, a graphical interface that attaches to a display, and/or a semiconductor integrated circuit device as described below, configured to perform the functions described herein. The resource management apparatus 108 may be configured to control one or more computing devices 102 to selectively enable and/or disable various features 116. The resource management apparatus 108 may create a different product from two physically identical computing devices 102, with each having different features 116 enabled and/or disabled.

The resource management apparatus 108 controls the circuit board 104 of the computing device 102. The circuit board 104 may include a semiconductor integrated circuit device (e.g., one or more chips, die, or other discrete logic hardware) or the like. The circuit board 104 may be a field-programmable gate array ("FPGA") or other programmable logic, firmware for an FPGA or other programmable logic, microcode for execution on a microcontroller. For example, the circuit board 104 may be an application-specific integrated circuit ("ASIC"), a processor, a processor core, or the like.

In various embodiments, the resource management apparatus 108 has a different circuit board 104 than the computing device 102. For example, the resource management apparatus 108 may be located separately and/or externally from the circuit board 104 of the computing device 102. In another embodiment, the resource management apparatus 108 is located on the circuit board 104 of the computing device 102. For example, the resource management apparatus 108 may be mounted on a printed circuit board 104 with one or more electrical lines or connections (e.g., volatile memory, a non-volatile storage medium, a network interface, a peripheral device, a graphical/display interface, or the like).

The hardware component 106 of the circuit board 104 (and/or the hardware device of the resource management apparatus 108) may include one or more pins, pads, or other electrical connections configured to send and receive data (e.g., in communication with one or more electrical lines of a printed circuit board 104 or the like). One or more hardware circuits and/or other electrical circuits may be configured to perform various functions of the circuit board 104 of the computing device 102 and/or the resource management apparatus 108. The resource management apparatus 108 can electrically couple to the circuit board 104 in the computing device 102 and remotely couple to the master management device 110 to enable or disable data regions 120 of firmware 118 and turn on/off the circuit board 104 features 116.

The semiconductor integrated circuit device of the circuit board 104, for example, on the computing device 102 (or the hardware device of the resource management apparatus 108) in certain embodiments, includes and/or is communicatively coupled to one or more volatile memory media, which may include but is not limited to random access memory ("RAM"), dynamic RAM ("DRAM"), cache, or the like.

In one embodiment, the semiconductor integrated circuit device, the circuit board 104, or other hardware appliance of the resource management apparatus 108 and/or the computing device 102 includes and/or is communicatively coupled to one or more non-volatile memory media, which may include but is not limited to: NAND flash memory, NOR flash memory, nano random access memory (nano RAM or "NRAM"), nanocrystal wire-based memory, silicon-oxide based sub-10 nanometer process memory, graphene memory, Silicon-Oxide-Nitride-Oxide-Silicon ("SONOS"), resistive RAM ("RRAM"), programmable metallization cell ("PMC"), conductive-bridging RAM ("CBRAM"), magneto-resistive RAM ("MRAM"), dynamic RAM ("DRAM"), phase change RAM ("PRAM" or "PCM"), magnetic storage media (e.g., hard disk, tape), optical storage media, or the like.

The data network 112, in various embodiments, includes a digital communication network that transmits digital communications, for example, between a computing device 102 and a server 114 having the resource management apparatus 108 on a separate master management device 110. The data network 112 may include a wireless network, such as a wireless cellular network, a local wireless network, a Wi-Fi network, a Bluetooth® network, a near-field communication ("NEC") network, an ad hoc network, and/or the like. The data network 112 may include a wide area network ("WAN"), a storage area network ("SAN"), a local area network ("LAN") (e.g., a home network), an optical fiber network, the internet, or another digital communication network. The data network 112 may include two or more networks. The data network 112 may include one or more servers 114, routers, switches, and/or other networking equipment. The data network 112 may also include one or more computer-readable storage media, such as a hard disk drive, an optical drive, non-volatile memory, RAM, or the like.

The wireless connection may be a mobile telephone network. The wireless connection may also employ a Wi-Fi network based on any Institute of Electrical and Electronics Engineers ("IEEE") 802.11 standards. Alternatively, the wireless connection may be a Bluetooth® connection. In addition, the wireless connection may employ a Radio Frequency Identification ("RFID") communication including RFID standards established by the International Organization for Standardization ("ISO"), the International Electrotechnical Commission ("IEC"), the American Society for Testing and Materials® (ASTM®), the DASH7™ Alliance, and EPCGlobal™.

Alternatively, the wireless connection may employ a ZigBee® connection based on the IEEE 802 standard. In one embodiment, the wireless connection employs a Z-Wave® connection as designed by Sigma Designs®. Alternatively, the wireless connection may employ an ANT® and/or ANT+® connection as defined by Dynastream® Innovations Inc. of Cochrane, Canada.

The wireless connection of data network 112 may be through an infrared connection, including connections conforming at least to the Infrared Physical Layer Specification ("IrPHY") as defined by the Infrared Data Association® ("IrDA" 0). Alternatively, the wireless connection may be a cellular telephone network communication. All standards and/or connection types include the latest version and revision of the standard and/or connection type as of this application's filing date.

One or more servers 114 may be embodied as blade servers, mainframe servers, tower servers, rack servers, etc., in one embodiment. The one or more servers 114 may be configured as mail servers, web servers, application servers, FTP servers, media servers, data servers, web servers, file servers, virtual servers, and/or the like. Servers 114 may be communicatively coupled (e.g., networked) over a data network 112 to one or more computing devices 102 and may be configured to execute or run machine learning algorithms, programs, applications, processes, and/or the like.

As described in greater detail below, a computing device 102 can have an extensive supply chain. For example, the supply chain may include the chipset manufacturers (aka chipmakers), logic board manufacturer and/or circuit board 104 assembler, and/or device makers/assemblers. The manufacturers of the computing device 102 work together to manufacture and distribute a circuit board 104 on a particular computing device 102. Generally, manufacturers and assemblers in the supply chain attempt to obtain any pertinent licenses from the relevant patent holders prior to introducing a new circuit board 104 and/or computing device 102 to the market.

For example, a hardware component 106 (e.g., a chip on the circuit board 104) may use various industrial standards/technologies that are licensed and protected. Many such features have become industry standards and may use a FRAND fee agreement and/or another agreed-upon licensing arrangement.

As used herein, "manufacturer" refers to any organization or entity along the supply chain, from the fabrication of a chip or another component to a consumer-ready product. A "chipmaker" is the particular manufacturer of the circuit board 104, and a device assembler assembles the viable consumer product utilizing the circuit board in a computing device 102 that is sold to the end-user as a product (e.g., laptop or cellphone).

Given the scale of the various technologies and functions on each hardware component 106 and the different configurations of each circuit board 104, manufacturers often seek to obtain a broad technology license before releasing a new product, e.g., cellphone, computer, or laptop. However, this can be costly if certain technologies and/or features are not desirable for a particular circuit board 104. In various embodiments described below, the chipmaker may include a new technology on a circuit board 104, which the device assembler (and/or consumer) decides not to include in the device. Previously, to disable a feature 116 on a circuit board 104, device assemblers would design and order a new circuit board 104 without the technology. This practice adds significant model/SKU complexity for tracking the physical orders of old and new circuit boards 104 with and without the functional capability. However, the ability to permanently disable features enables the device assembler to create similar physical consumer models having different digital architectures. The configuration may also enable more specificity for licensing surcharges since the digital architecture is known.

The number of technologies for each hardware component 106 may make variations in just one or two features 116 too significant of a time commitment to renegotiate licensing fees, e.g., for "small" feature 116 variations. However, including unused technologies on each circuit board 104 may result in substantial cost increases for the computing device 102. In some embodiments, the increased costs may be justified since the costs may be small, or the consumer may want the added features 116. However, in other embodiments, these features may only increase the cost of the computing device 102 (e.g., for licensing fees) for which the technology will not be used or accessed.

Chipmakers sometimes attempt to fuse features 116 on the circuit board 104 to remove a feature 116, but this practice increases the complexity for the device assembler. For example, the device assembler needs to create a separate SKU for each modified circuit board 104 and track the modified functionality and features of each SKU for the circuit board 104. The device assembler may also need to pay for licenses for the disabled features 116, which may increase the cost of the computing device 102 to the end consumer.

Some examples of feature fusing may include eFuses and/or external resistors. Both eFuses and external resistors operate by increasing the resistance to the features 116 on the physical, electronic circuit. This may increase the chip's cost and/or remove die space for other hardware components 106 and are not generally software configurable. A circuit board 104 combining several eFuses for several codecs (e.g., features 116) could add significant cost to the hardware component 106 and/or the circuit board 104. Since chipmakers may not want to alter the design of the circuit board 104 or add the eFuses proposed by the device assembler to enable or disable technologies, device assemblers are often unable to fulfill specific customer requests for enabling or disabling specific technologies. The cost of redesigning a circuit board 104 without the enabled features can become cost-prohibitive. Accordingly, there is a need from the perspective of the device assembler and end-user that the chip supplier provides a mechanism to either enable or disable desired features on the circuit board 104 at the time of assembly.

The Applicant has found a smart inclusion/exclusion method for granular control of technologies and/or features 116 on a hardware component 106. The method can selectively enable/disable various technologies and/or features of the hardware component 106 after the circuit board has been built. The selective inclusion of various technologies (e.g., features 116) allows chipmakers and device assemblers to target the desired technology and/or features 116 for client-driven systems where the functionality justifies the cost. In other words, the selective feature 116 inclusion/exclusion on the circuit board 104 advances marketplace competition by providing the consumer a broader assortment of technologies available on the hardware components 106 of a computing device 102. This enables more efficient distribution of new technologies for the models/users that are willing to pay for the new features 116, while also providing a broader assortment of computing products available to customers to customize the desired technologies and features 116 for their individual needs and/or practice.

The Applicant has found that these systems and methods enable the device assemblers to order commercially available standard circuit boards 104 from the chipmaker and build various devices from the same standard base configuration. The device assembler can create new virtual SKUs and/or circuit boards 104 based on the model's base configuration, submodel, and/or location (e.g., country) to enable/disable various technology features 116 for that product family. Further, the enablement/disablement method cannot be later modified by the end-consumer. The system and method can ensure that the enabled features 116 have the proper licenses. This may also prevent the distribution of unlicensed technology by either the chipmaker or the device assembler.

In one embodiment, the chipmaker can set a one-time "virtual fuse" that the device assembler can modify. For various models, sub-models, or countries where different technologies are required, the virtual fuse can be adjusted at the time of assembly. When the virtual fuse is "on," the hardware feature 106 technology is enabled, and the feature 116 is available technology for that the computing device 102. If, in contrast, the virtual fuse is "off," then the technology remains disabled and cannot be enabled by the end-user. For example, the firmware for that technology is "bricked."

The Applicant has found that an external fuse block 124 on a resource management apparatus 108 located off the circuit board 104 and/or a write-once/one-time programmable storage on the circuit board 104 of the computing device 102 can be used to selectively enable/disable features 116 during the assembly of the computing device 102.

The chipmaker can establish enabling/disabling values for the hardware feature 106 in a software-driven process during the chip's manufacture in one embodiment. The device assembler can use a resource management apparatus 108 configured for the particular circuit board 104 to selectively enable/disable features of the computing device 102 during the assembly. The resource management apparatus 108 can send a bit and/or code to hardware components 106 to enable or disable various features. Since the resource management apparatus 108 can be stored externally from the circuit board 104, the supply chain's overall complexity for both the chipmaker and the devise assembler may be simplified.

In another variation, an embedded firmware 118 on the circuit board 104 may include a special and/or unique program to create a permanent virtual switch or virtual fuse 122. The virtual fuse 122 is stored within a data region 120 of the firmware 118 and either enables or disables the technology. The data region 120 selectively enables the firmware 118 of the component or "bricks" the component so that the processor 204 and/or the circuit board 104 cannot access it.

During the circuit board 104 manufacturing, the chipmaker can install the virtual switch by installing the program into the data region 120 of the firmware 118. The device assembler can use a resource management apparatus 108 to control the hardware component 106 and may either disable or enable various features 116. Virtual fuse 122 can temporarily or permanently change the state of a bit in the data region 120 and selectively disable the technology and/or the feature 116 on the circuit board 104. Virtual fuse 122 may access a memory storage device 126 of the hardware component 106 and/or directly modify data regions 120 of firmware 118.

After the bit is changed/written in the data region 120 of the firmware 118, a virtual fuse 122 of the resource management apparatus 108 can further operate on the hardware component 106 to reprogram the firmware 118 and/or otherwise modify the circuit board 104. On initial startup, the resource management apparatus 108 may send a bit or code that changes the bit only once and either permanently erases the data region 120 or enables the feature 116 on the hardware component 106. Once the bit is written to and/or erased from the data region 120 of the firmware 118, the state of the hardware component 106 cannot be changed. In one embodiment, the resource management apparatus 108 sends a code that causes the data region 120 of the firmware 118 to write no-op codes.

At system boot and/or reset, the embedded firmware 118 on either the hardware component 106 or the circuit board 104 reads the virtual fuse 122. When the virtual fuse is on, the technology feature is enabled. In contrast, when the virtual fuse 122 is off, the feature 116 is disabled for the hardware component 106. The processor 204 and/or the circuit board 104 can determine whether the feature 116 has been permanently disabled by reading virtual fuse 122. Similarly, drivers or other components may read the virtual fuse 122 settings as needed.

Figure 3:
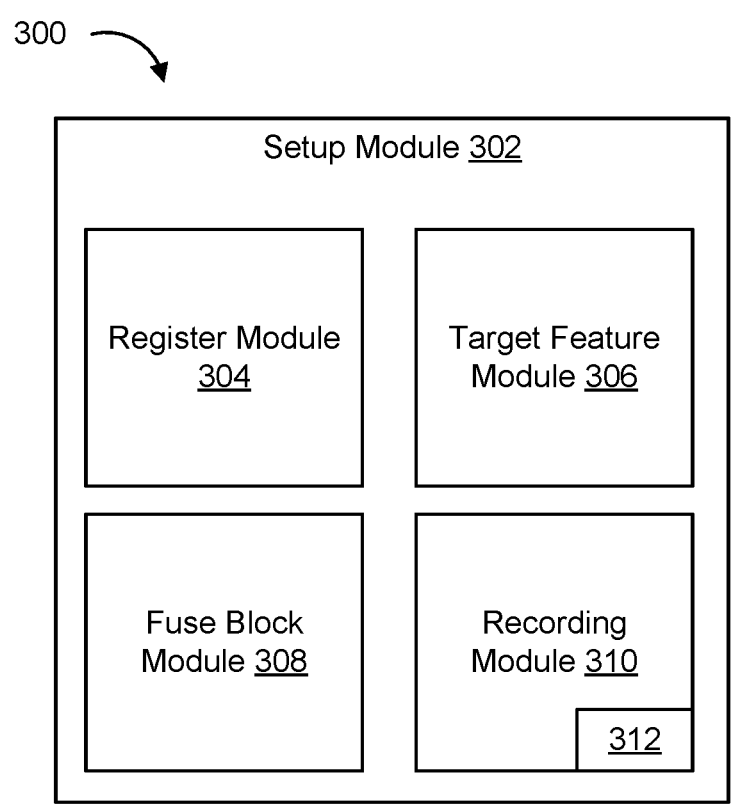
FIG. 3 is a schematic block diagram illustrating one embodiment of an apparatus for technology management of a device during assembly of the computing device.

Since the firmware 118 is a trusted system component, the chipmaker and/or device assembler can track the data region 120 (e.g., in the resource management apparatus 108 and/or register module 304 of apparatus 300 shown in FIG. 3). The chipmaker and/or device assemblers can later verify and attest that the sold configuration was licensed, secured, and unmodified. Further, the firmware lifecycle may be enhanced by including this self-modifying the data region 120 and modifying it with a virtual fuse 122 that selectively enables or removes the firmware 118 for one or more features 116 in the data region 120. For example, keeping the resource management apparatus 108 on another device separate from the circuit board 104 ensures that the manufacturing codes and/or bits to modify data regions 120 of firmware 118 remain secure.

FIG. 2 is a schematic block diagram of an apparatus 200 comprising various hardware components 106. The apparatus 200 has hardware components 202 that may be functionally the same or similar as the circuit board 104 having hardware components 106. In various embodiments, hardware components 202 of the apparatus 200 can include processors 204 (e.g., a central processing unit or CPU 206, another processor 204 or processor core, a field-programmable gate array ("FPGA") or other programmable logic, an application-specific integrated circuit ("ASIC"), a controller, a microcontroller, and/or another semiconductor integrated circuit device). The apparatus 200 includes a CPU 206 and various processors 204. Processor 204 includes CPU 206 but may also include additional processing cores or processors 204 on the apparatus 200. Stated differently, CPU 206 is a specialized processor 204, but other processors 204 may be included on the apparatus 200.

The apparatus 200 can also include a memory storage device 208 having various memory addresses 210 for volatile memory or RAM 212, and/or a non-volatile storage medium, e.g., ROM 214. In various embodiments, memory storage device 208 may include an erasable electronic read-only memory or EEPROM device 216. The memory storage device 208 may have addresses 210 for data regions 220 of firmware 222, system software 224 (e.g., an operating system), and/or other programs run by processor 204. Additional hardware components 202 of the apparatus 200 may include a graphics card or GPU 226 having a video codec 228 and/or an audio codec 230, an RF Transceiver 232, a camera image signal processor 234, a Near Field Communications (NFC) wireless subsystem 236 including a Bluetooth subsystem 238 and a Wi-Fi subsystem 240, a digital signal processor or DSP 242, an artificial intelligence neural network or AI engine 244, a modem 246, such as a cellular modem 248, and connections to USB ports 252 and the like.

For example, the apparatus 200 can have a charging port 250, a security support system 254, and/or cellular technology (e.g., a cellular modem 248). As used herein, various components are shown on a single component (e.g., video codec 228 and audio codec 230 on GPU 226) can be separated onto one or more different hardware components 202.

Various data regions 220 may have different addresses 210 on the apparatus 200 and/or the hardware component 202 that encode various technologies. Virtual fuse 256 can target one or more specific addresses 210 for data regions 220 encoding firmware 222 for features 260 on the apparatus 200. FIG. 2 shows one exemplary embodiment of the apparatus 200 having several hardware components 202 and features 260, but it should be recognized that other hardware components 202, features 260, and/or configurations of the apparatus 200 are within the scope of the present disclosure.

Each hardware component 202 includes data regions 220 storing the firmware 222 configured to enable one or more features 260 to communicate with the CPU 206, the processors 204, and/or the system software 224 on the apparatus 200. For example, data regions 220 and/or firmware 222 may be stored on a non-volatile memory storage device 208, such as an EPROM device, an EEPROM device, and/or a flash memory device. The CPU 206 may utilize the system software 224 that communicates with and thereby utilizes the various enabled technologies and/or features 260 of each hardware component 202. For example, the system software 224 may enable and/or enhance video codec 228 on GPU 226 through interactions of the CPU 206 with the data regions 220 of firmware 222.

The system software 224 may be run by the CPU 206 and/or other processors 204 to communicate and/or control features 260 of connected hardware components 202. The system software 224 may be a processor-side application 262 that facilitates and/or enables the communication between the CPU 206 and various hardware components 202. As used herein, firmware 222 is a client-side code stored on the hardware component 202 that enables the hardware component 202 to communicate with the CPU 206 and/or the apparatus 200. The system software 224 may include or interface with firmware 222 of the hardware component 202. The firmware 222 installed on the hardware component 202 may enable various features 260 of the hardware component 202 that can be operated by the CPU 206 and/or other processors 204.

The hardware component 202 includes one or more data regions 220 in the firmware 222 to selectively enable or disable the features 260 of the hardware component 202. The data regions 220 provide selectivity for features 260 on the apparatus 200 and enable granular specificity for enabled or disabled features 260. The apparatus 200 functionality is a compilation of the variation and quantity of the enabled features 260 on the hardware components 202 and the ability to control/use the hardware component 202 through system software 224.

For example, video codec 228 of GPU 226 enhances the apparatus 200 by providing a standardized format for communicating with the system software 224. When properly configured with the appropriate firmware 222, GPU 226 enhances the apparatus 200 with the various features 260 provided by the video codec 228 to compress/decompress, communicate, transmit, and/or display video signals. However, each of these features 260 is only available to the apparatus 200 if the data region 220 is enabled and the appropriate firmware 222 is installed and readable by the system software 224 for the specific video codec 228 and/or GPU 226 feature.

Similarly, NFC wireless subsystems 236 use a standardized and appropriate firmware 222 to enable various features 260 for a Bluetooth subsystem 238 and/or Wi-Fi subsystem 240. In one embodiment, the enabled data region 220 of the firmware 222 may enable the apparatus 200 to have 5G cellular capability the feature 260, whereas the same the apparatus 200 without this firmware 222 (e.g., a bricked data region 220) would only have access to a 4G spectrum. The Wi-Fi subsystem 240 may include another data region 220 with different firmware 222 for a Wi-Fi 6-ready the feature 260 compared to 802.11a/b/g, or 802.11n Wi-Fi features 260.

One feature of this application is a device assembler's ability to enable and/or disable various features 260 after the apparatus 200 construction and thereby modify a digital architecture 264 without changing the physical architecture 266 of the apparatus 200. For example, the same apparatus 200 can include a cellular modem 248 that supports both 4G and 5G features 260 but have only 4G features enabled. This may make the cellphone more affordably by not necessitating a new apparatus 200 design and/or reducing the cellphone device's licensing fees.

The enablement of different features 260 on the apparatus 200 may include costs, such as design and testing costs and/or licensing fees for the various enabled technologies. This can increase the total cost of the apparatus 200 and/or the computing device 102. The consumer may opt to pay a reduced cost for a computing device 102 with certain features 260 disabled.

However, previously, manufacturers and/or assemblers have lacked granularity on the specific individual enabled features 260 sold to the user. This meant the assembler might pay to license all the features 260 regardless of whether they were enabled or used. The Applicant has found that the ability to disable various technologies and/or features 260 selectively and permanently on an apparatus 200 provides the manufacturer the benefit of mass production of the same designed apparatus 200. This feature also provides the end-consumer the selective variability for desired features 260 on a particular computing device 102. The cost of designing and manufacturing different virtual SKU products is more efficient than physically changing the structures on the circuit board 104. The consumer also has greater access to the desirable features 260 for a particular application without paying for undesired technologies.

Selectively and permanently disabling features 260 after manufacture (e.g., during assembly of the computing device 102) enhances the ability to mass-produce an apparatus 200 the physical apparatus 200. The selectivity also permits a broad assortment of features 260 in the digital architecture for end-user selection. Because the resource management apparatus 108 indicates whether the technology was successfully removed in response to operating a virtual fuse, the master management device 110 on a remote server 114 may maintain a list of enabled features 260 on each computing device 102. If the assembler and/or manufacturer is later accused of patent infringement, they can affirmatively demonstrate which features were paid for (e.g., licensed) and enabled and which features were permanently disabled on the apparatus 200. Enabling the manufacturer and/or assembler to mass-produce/purchase the same physical architecture 266 on the apparatus 200 also provides a broader assortment of different features 260 to the consumer.

FIG. 3 is a schematic block diagram illustrating one embodiment of a circuit board 104 or apparatus 300 with enabled features 260 on individual hardware components 202. A setup module 302 (e.g., the resource management apparatus 108 operating on system software 224 of the information handling device) may include code executable on processor 204 to enable/disable data regions 220 of firmware 222 of various hardware components 202. Setup module 302 includes a register module 304, a designation module 306, a fuse block module 308, and a recording module 310.

With reference to FIGS. 2 and 3, the apparatus 300 has processor 204 electronically coupled to a memory storage device 208 and each hardware component 202. The processor 204 receives instructions from the resource management apparatus 108 to control various features 260 of the apparatus 200. Specifically, the setup module 302 may include individual modules (e.g., register module 304, target feature module 306, fuse block module 308, recording module 310, register store 312, etc.) that function to enable and/or disable various features 260 provided by the hardware components 202 on the apparatus 200. In various embodiments, the virtual fuse 256 can modify and/or change the digital architecture 264 of the apparatus 200 without affecting the physical architecture 266 of the apparatus 200.

For example, a setup module 302 can execute code and/or send a bit to a data region 220 of the firmware in a hardware component 202. In response to receiving the bit, the data region 220 encodes whether to enable or disable the feature 260 of the hardware component 202. When the feature 260 is enabled, the data region 220 encodes the firmware 222 for the feature 260. When the feature is disabled, the bit runs a program stored in the data region 220 to brick all or part of the chip and permanently remove the apparatus 200 and/or processor 204 access to the feature(s) controlled by the data region 220 on the hardware component 202. In another embodiment, the data region 220 operates a physical or electronic fuse 268 and permanently alters (e.g., removes and/or destroys) access to the circuit encoding the feature 260 of the hardware component 202. In yet another example, the virtual bit first encodes the data region 220 to remove access to a feature 260 and then operates the electronic fuse 268 to alter access to the data region 220 permanently.

The virtual fuse 256 can blow an electronic fuse 268 to an electronic circuit 270 that controls the feature 260 by writing and/or erasing codes firmware 222 of the hardware component 202. Once the electronic fuse 268 is blown, the electronic circuit 270 and the firmware 222 for the feature 260 of the hardware component 202 are not accessible to the processor 204. In various embodiments, the virtual fuse can write random bits and/or no-op codes in the data region 220 of the firmware 222, encoding the feature 260 of the hardware component to be removed. Virtual fuse 256 may erase the data region 220 and/or the firmware 222 for the feature 260 from the hardware component 202 and/or blow an electronic fuse 268 and/or electronic fuse 268 of the electronic circuit 270 controlling the feature 260 of the hardware component 202. For example, the electronic fuse 268 and/or electronic fuse 268 can be electronically coupled to the data region 220 of the firmware 222 or a particular portion of the hardware component 202 and/or firmware.

Memory storage device 208 stores executable code accessible to setup module 302 to control features 260 of hardware components 106 on the apparatus 200 by the processor 204. A register module 304 stores a record of hardware components 106 and/or features 260 of hardware components 106 on the apparatus 200. In some embodiments, register module 304 maintains a register store 312 for each enabled feature 260 of each hardware component 202 on the apparatus 200. For example, register module 304 records a firmware 222 configuration (e.g., version, update history, and/or compatibility) of each hardware component 202 and the features 260 enabled by the firmware 222. Register module 304 may include configurations and/or bit codes or keys for enabling and/or disabling firmware 222 and associated features of hardware components 106.

In various embodiments, an operator of apparatus 300 designates a feature 260 of the hardware component 202 to be removed from the apparatus 200. In embodiments, the setup module 302 can obtain the features 260 from either a human operator or a programmatic input, such as a setup module 302 for the features 260 of the apparatus 200 to be added and/or removed. For example, in one embodiment, an operator selects a specific feature 260 to be disabled on the apparatus 200, and the setup module 302 either recommends and/or determines a different related feature to enable/disable on the apparatus 200. Once apparatus 300 obtains the features 260 to enable/disable, a fuse block module 308 operates a virtual fuse 256 that sends one or more bits, e.g., to the firmware 222, and permanently remove access to the designated feature 260 of the hardware component 202 on the apparatus 200. Virtual fuse 256 can send a binary signal comprising one or more bits written to the firmware 222 of the hardware component 202 to either enable and/or disable the designated feature 260. In some embodiments, a bit (or binary signal) is sent to firmware 222 of the hardware component 202 and written in firmware 222 of the hardware component 202 to create virtual fuse 256 that disables access by processors 204 of the apparatus 200 from accessing either the designated the feature 260 and/or part or all of the hardware component 202.

In response to virtual fuse 256 of fuse block module 308 removing access from processor 204 to the designated feature 260, recording module 310 removes or deletes the feature 260 of the hardware component 202 from register store 312. In other words, recording module 310 amends the register store 312 to include only enabled features 260 of the apparatus 200. Recording module 310 can transmit a copy of the enabled features 260 on register store 312 to system software 224 and/or setup module 302. For example, a manufacturer or assembler of a computing device 102 that incorporates the apparatus 200 may store a copy of the enabled features 260 associated with an SKU for the apparatus 200. A virtual fuse 256 may alter firmware 222 on a hardware component 202 to enable/disable features 260 on the apparatus 200 selectively provides an apparatus 200 with the same or similar mass-produced physical architecture 266 with a varied digital architecture 264. The ability to selectively enable/disable features of the apparatus 200 after manufacture but during assembly, for example, enables an assembler to modify the circuit board 104 produced by the manufacturer for the specific consumer while also ensuring that appropriate licensing fees and/or other costs of the technology are appropriated associated with the SKU of the apparatus 200.

In various embodiments, device drivers, system software 224, installed programs, and/or other components coupled to processor 204 may read the register store 312. For example, the system software 224 may read the register store 312 to determine whether the virtual fuse 256 is enabled/disabled for a driver of the apparatus 200. In another embodiment, the register store 312 includes a list of all the hardware components 202 and their associated features 260 on the apparatus 200 and modifies the register store 312 of available features 260 and/or the hardware components 202 when each is removed by the virtual fuse 256.

The register store 312 may read the data regions 120 of the firmware 222 on the hardware component 202. For example, the register store 312 can read whether a first feature 116a of the hardware component 202 is permanently removed and read a second feature 116b of the hardware component 202 that is preserved on the apparatus 200. The recording module 310 can then update and/or maintain the register store 312.

In various embodiments, the memory storage device 208 encoding the firmware 222 is stored in electrically erasable programmable read-only memory (EEPROM) and/or an elastic flash read-only memory. The memory storage device is a stock Read-Only Memory ("stock ROM") device in other embodiments. EEPROM, flash, and/or stock ROM include a firmware 222 for each hardware component 202 on the apparatus 200. The system software 224 of one or more computing devices 102 can use the firmware 222 located on the hardware component 202 to control one or more features 260 of the hardware component 202. In various embodiments, the virtual fuse 256 operates on EPROM, EEPROM, flash memory, and/or stock ROM and thereby creates a new virtual apparatus 200 by controlling which data regions 120 on the firmware 222 are accessible. Virtual fuse 256 can control access to features 260 on the hardware component 202 and thereby changes the digital architecture 264 of the apparatus 200.

In some embodiments, the virtual fuse 256 is an external virtual fuse block 124 that is located externally from the apparatus 200 that has the processor 204 and the memory storage device 208. The manufacturer or assembler may retain the external virtual fuse block 124 of the hardware component 202.

Figure 4:
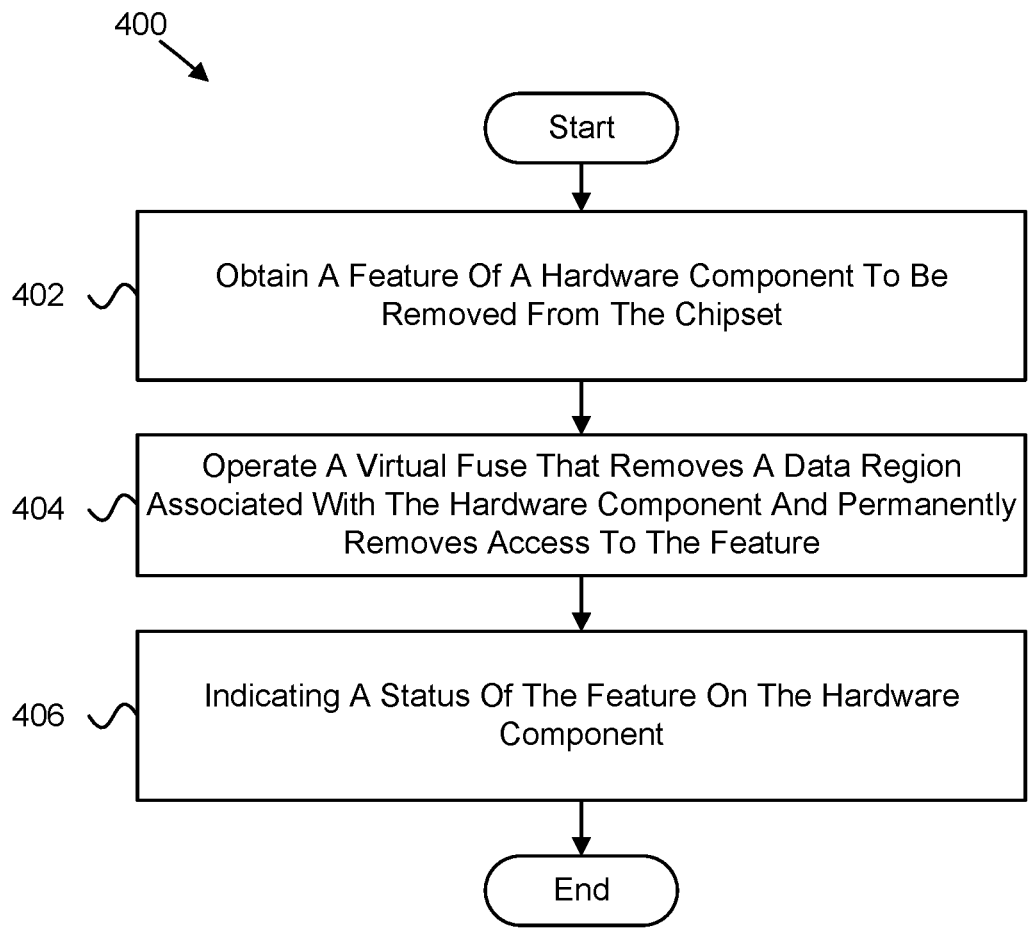
FIG. 4 is a schematic flow chart diagram illustrating one embodiment of a method of managing technology on a hardware component during assembly of the computing device.

FIG. 4 is a schematic block diagram illustrating a method 400 for selectively disabling features 260 on the apparatus 200 during assembly of a computing device, e.g., after the manufacture of the apparatus 200. In one embodiment, method 400 includes obtaining 402 a feature 260 of a hardware component 202 to be removed from the apparatus 200 and operating 404 a virtual fuse 256 that removes a data region 220 associated with the hardware component 202. In various embodiments, virtual fuse 256 may permanently remove access to the feature 260 on the apparatus 200. In response to operating the virtual fuse 256 to remove access to the feature 260, the method may include indicating 406 a status of the feature 260 on the hardware component 202. For example, the resource management apparatus 108 may indicate the feature 260 is disabled to a user-display and/or to separate the master management device 110 on a server 114.

Figure 5:
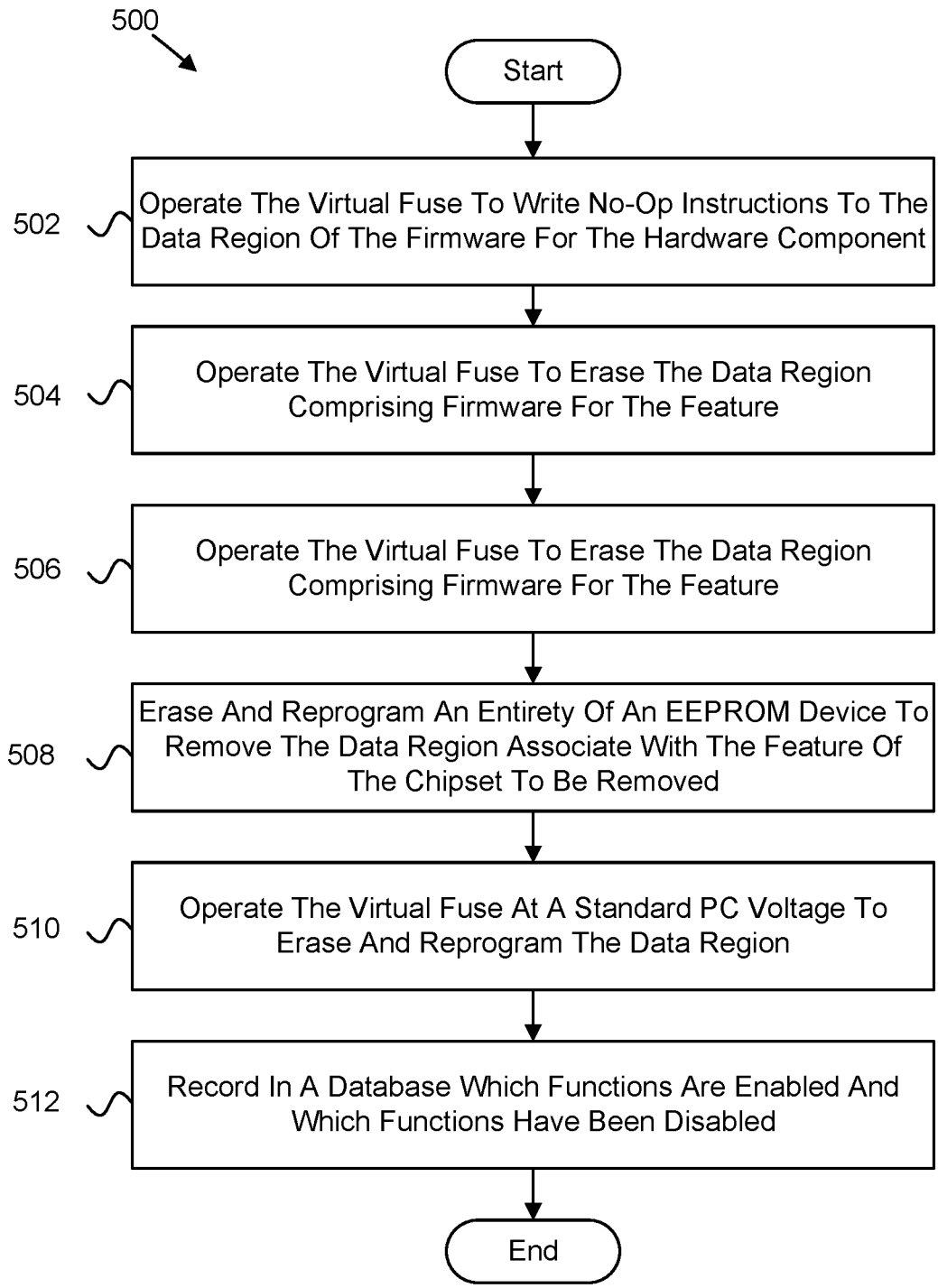
FIG. 5 is a schematic flow chart diagram illustrating optional methods for the embodiment shown in FIG. 4 to selectively manage technology features on a hardware component during assembly of the computing device.

FIG. 5 is a schematic block diagram illustrating various optional methods 500 of the method 400 shown in FIG. 4 for selectively disabling features 260 on the apparatus 200 at the time of assembly. Method 500 may operate 502 the virtual fuse 256 to erase the data region 220 comprising firmware 222 for the feature 260 of the hardware component 202. Method 500 may include operating 504 the virtual fuse 256 to write no-op instructions in the data region 220 of the firmware 222 for the hardware component 202. The no-op instructions render the feature 260 of the hardware component 202 inoperable. In some embodiments, operating 506 the virtual fuse 256 may blow an electronic fuse 268 to an electronic circuit 270 of the data region 220 associated with the feature 260. In various embodiments of method 500, a single virtual fuse 256 may operate some or all steps 502 through 506.

Virtual fuse 256 may erase 508 an entirety of a memory device 208, such as the EPROM device, the EEPROM device 216, and/or the flash memory device 218. Virtual fuse 256 may reprogram the memory device 208 (e.g., EEPROM device 216 and/or flash memory device 218) to remove the data region 220 associated with the feature 260 to be removed from the apparatus 200. In another embodiment, virtual fuse 256 uses a standard PC voltage to erase and reprogram 510 the data region 220 of the memory device 208 (e.g., the EEPROM device 216 or the flash memory device 218) associated with the feature 260 to be removed from the apparatus 200.

In one embodiment, the virtual fuse 256 is an external virtual fuse block 124 located externally from the apparatus 200. External virtual fuse block 124 may send a bit to a data region 220 of firmware 222 associated with the feature 260 to be removed from the hardware component 202. The virtual fuse block 124 can write no-op instructions on the data region 220 for the firmware 222 of the feature 260 to be removed from the hardware component 202. In this way, the external virtual fuse block 124 can be retained separately. This configuration may help the manufacturers, chipmakers, and/or device assemblers control and/or monitor the external virtual fuse block 124. In various embodiments, the manufacturer and/or assembler of the hardware component 202 retains external virtual fuse block 124. In various embodiments, the enabled/disabled features on apparatus 200 may be stored and/or recorded 512 in a database. For example, the enabled features 260 in data region 220 may be stored in a database on server 114 and/or in resource management apparatus 108. Server 114 may record the disabled features 260 in data region 220 of hardware component 202.

Figure 6:
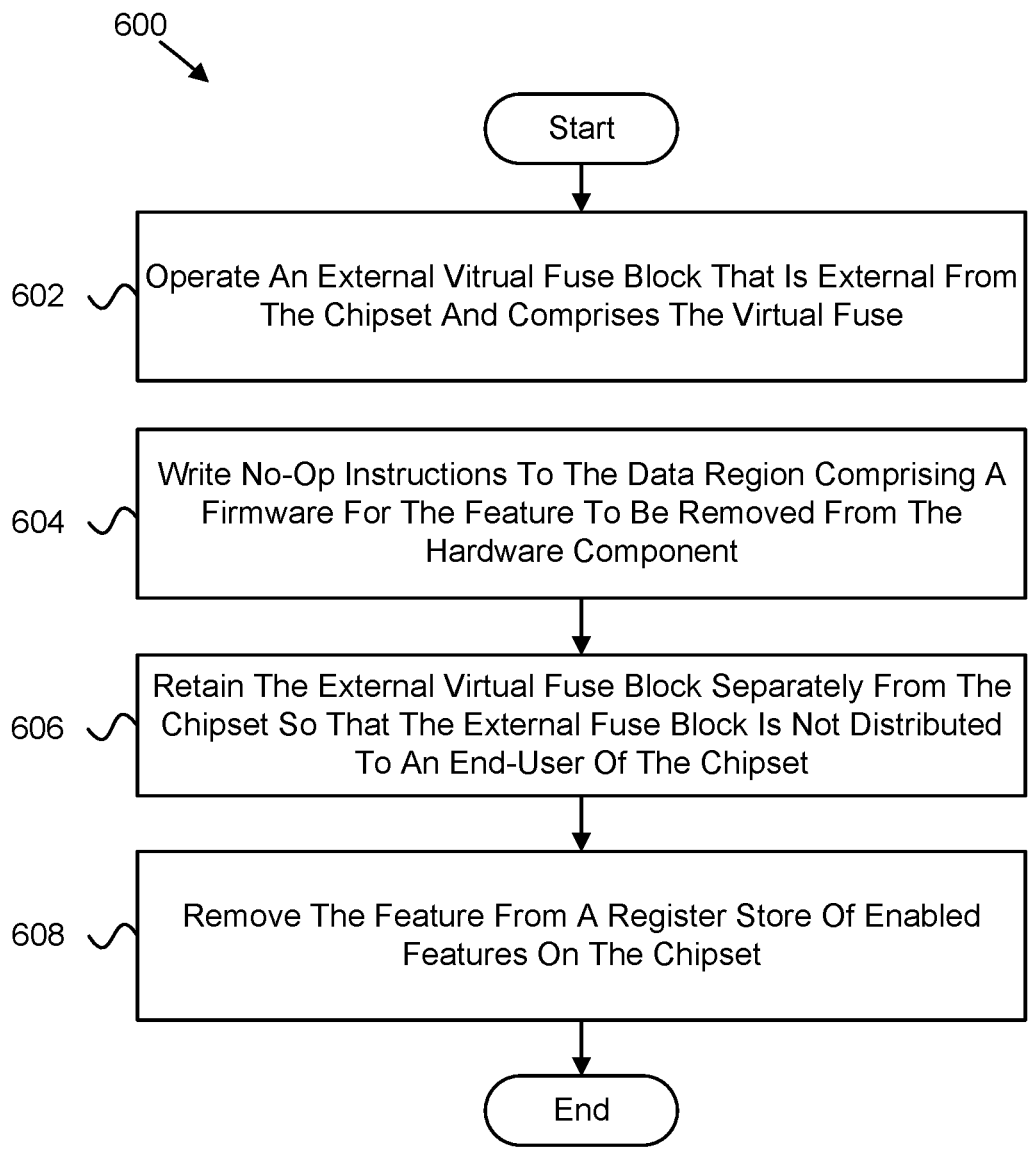
FIG. 6 is a schematic flow chart diagram illustrating optional methods for the embodiment shown in FIG. 4 to selectively manage technology features on a hardware component during the computing device assembly.

FIG. 6 is a schematic block diagram illustrating various optional methods 600 of the method 400 shown in FIG. 4 for selectively disabling features 260 on the apparatus 200 at the time of assembly. In various embodiments, method 600 operates 602 an external virtual fuse block 124 that is external from the apparatus 200 and comprises the virtual fuse 256. Method 600 may write 604 no-op instructions to the data region 220 of the firmware 222 for the feature 260 to be removed from the hardware component 202. Method 600 may maintain 606 the register store 312 of enabled features on the apparatus 200. In other words, register store 312 maintains a record of enabled features 260 on the apparatus 200 accessible by processor 204 and/or an operator of the system/method. In response to the virtual fuse 256 permanently removing processor 204 access to the feature 260, method 600 can remove 608 the feature 260 from register store 312. Register store 312 can store a list or register of all the enabled features 260 of each hardware component 202 on the apparatus 200. Similarly, register store 312 can store a list of each disabled feature 260 for a particular SKU of the apparatus 200.

Embodiments may be practiced in other specific forms. The described embodiments are to be considered in all respects only as illustrative and not restrictive. Therefore, the scope of the invention is indicated by the appended claims rather than by the foregoing description. All changes which come within the meaning and range of equivalency of the claims are to be embraced within their scope.

What is claimed is:

1. An apparatus, comprising:
a processor; and
a memory storage device that stores code executable by the processor to:
identify a feature of a hardware component for removal from the hardware component;
command a virtual fuse to initially encode a data region associated with operating the feature to prevent computational access to the feature and subsequently blow an electronic fuse to prevent electrical access to the hardware component, wherein encoding the data region and blowing the electronic fuse permanently disables the feature on the hardware component; and indicate a status that the feature is permanently disabled on the hardware component in response to operating the virtual fuse to permanently disable the feature on the hardware component.

2. The apparatus of claim 1, wherein the virtual fuse is read by a driver of a system software.

3. The apparatus of claim 1, wherein a firmware of the hardware component has a plurality of data regions, wherein each data region in the plurality of data regions is associated with a singular feature of the hardware component, and wherein a first feature of the hardware component is permanently removed and a second feature of the hardware component is preserved.

4. The apparatus of claim 1, wherein, in encoding the data region, the virtual fuse erases the data region comprising a firmware for the feature of the hardware component.

5. The apparatus of claim 1, wherein, in blowing the electronic fuse, the virtual fuse blows a physical fuse to an electronic circuit that controls the feature of the hardware component.

6. The apparatus of claim 1, wherein:
in encoding the data region, the virtual fuse:
writes no-op instructions on the data region of a firmware associated with the feature of the hardware component; or
erases the firmware of the data region for the feature on the hardware component; and
in blowing the electronic fuse, blows a physical fuse to an electronic circuit associated with the feature of the hardware component.

7. The apparatus of claim 1, wherein the memory storage device comprises an Electronically Erasable Programmable Read-Only Memory (EEPROM) device, wherein the EEPROM device is at least partially erased and reprogrammed to remove the data region associated with the feature to be removed.

8. The apparatus of claim 1, wherein the memory storage device comprises flash memory that uses a standard PC voltage to erase and reprogram the data region associated with the feature to be removed.

9. The apparatus of claim 1, wherein the virtual fuse comprises a virtual fuse block that is external from the hardware component having the processor and the memory storage device.

10. The apparatus of claim 9, wherein the external fuse block is retained on a server that is external to abd separate from the apparatus.

11. A method, comprising:
identifying a feature of a hardware component for removal from the hardware component;
commanding a virtual fuse to initially encode a data region associated with operating the feature to prevent computational access to the feature and subsequently blow an electronic fuse to prevent electrical access to the hardware component, wherein encoding the data region and blowing the electronic fuse permanently disables the feature on the hardware component; and
indicating a status that the feature is permanently disabled on the hardware component in response to operating the virtual fuse to permanently disable the feature on the hardware component.

12. The method of claim 11, wherein commanding the virtual fuse to initially encode the data region writes no-op instructions to a firmware for the hardware component that renders the feature of the hardware component permanently inoperable.

13. The method of claim 11, wherein commanding the virtual fuse to initially encode the data region erases a firmware for the feature of the hardware component.

14. The method of claim 11, wherein commanding the virtual fuse to subsequently blow the electronic fuse comprises blowing a physical fuse to an electronic circuit of the data region operating the feature.

15. The method of claim 11, wherein:
commanding the virtual fuse to initially encode the data region comprises:
writing no-op instructions on the data region of a firmware associated with the feature of the hardware component; or
erasing the firmware of the data region for the feature on the hardware component; and
commanding the virtual fuse to subsequently blow the electronic fuse comprises blowing a physical fuse to an electronic circuit operating the feature of the hardware component.

16. The method of claim 11, wherein commanding the virtual fuse to initially encode the data region comprises:
erasing an EEPROM device; and
reprogramming the EEPROM device to remove the data region associated with the feature to be removed from the hardware component.

17. The method of claim 11, wherein commanding the virtual fuse to initially encode the data region comprises:
using a standard PC voltage to erase and reprogram the data region of a flash memory device associated with the feature to be removed from the hardware component.

18. The method of claim 11, wherein:
the virtual fuse is located on a virtual fuse block that is external from the hardware component; and
the method further comprises writing no-op instructions to a firmware for the feature to be removed from the hardware component.

19. The method of claim 18, wherein the external virtual fuse block is retained on a server that is external to and separate from an apparatus including the hardware component.

20. A computer program product, comprising a computer-readable storage medium having program instructions embodied therewith, the program instructions are executable by a processor to cause the processor to:
identify a feature of a hardware component for removal from the hardware component;
command a virtual fuse to initially encode a data region associated with operating the feature to prevent computational access to the feature and subsequently blow an electronic fuse to prevent electrical access to the hardware component, wherein encoding the data region and blowing the electronic fuse permanently disables the feature on the hardware component; and
indicate a status that the feature is permanently disabled on the hardware component in response to operating the virtual fuse to permanently disable the feature on the hardware component.

* * * * *